(12) United States Patent
Song (10) Patent No.: US 9,857,526 B2
(45) Date of Patent: Jan. 2, 2018

(54) BACKLIGHT UNIT

(71) Applicant: Seoul Semiconductor Co., Ltd., Ansan-si (KR)

(72) Inventor: Young Jun Song, Ansan-si (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 52 days.

(21) Appl. No.: 14/320,114

(22) Filed: Jun. 30, 2014

(65) Prior Publication Data

US 2014/0313771 A1    Oct. 23, 2014

Related U.S. Application Data

(63) Continuation-in-part of application No. PCT/KR2013/010425, filed on Nov. 15, 2013.

(30) Foreign Application Priority Data

Nov. 20, 2012    (KR) .................... 10-2012-0131685

(51) Int. Cl.
- *F21V 8/00* (2006.01)
- *G02F 1/1335* (2006.01)
- *H01L 33/50* (2010.01)

(52) U.S. Cl.
CPC ............ *G02B 6/0073* (2013.01); *G02B 6/005* (2013.01); *G02B 6/009* (2013.01); *G02B 6/0031* (2013.01);
(Continued)

(58) Field of Classification Search
CPC .... G02B 6/0073; G02B 6/0031; G02B 6/009; G02B 6/005; G02B 6/0088; G02F 1/133617; H01L 33/505; H01L 33/508
See application file for complete search history.

(56) References Cited

U.S. PATENT DOCUMENTS 6,650,044 B1  11/2003 Lowery
7,520,652 B2   4/2009 Yamashita et al.
(Continued)

FOREIGN PATENT DOCUMENTS

JP    2004-235669    8/2004
JP    2009-231256   10/2009
(Continued)

OTHER PUBLICATIONS

International Search Report dated Feb. 17, 2014 in International Patent Application No. PCT/KR2013/010425.
(Continued)

*Primary Examiner* — Elmito Breval
*Assistant Examiner* — Naomi M Wolford
(74) *Attorney, Agent, or Firm* — H.C. Park & Associates, PLC (57) ABSTRACT

A backlight unit includes: a light guide plate of an entirely flat structure; a light emitting element disposed on at least one side of the light guide plate; a first reflection part disposed under the light guide plate and having one side thereof extended to a region where the light emitting element is positioned; a second reflection part disposed on the light emitting element; and a housing for accommodating the light guide plate, the light emitting element, and the first and second reflection parts, wherein the housing has a second side which is vertically extended upwards with respect to a first side which defines a lateral cross section of the housing in which the light emitting element is accommodated as the lower side, and a third side which is vertically extended inwards with respect to the second side.

15 Claims, 4 Drawing Sheets

(52) U.S. Cl.
CPC ..... *G02B 6/0088* (2013.01); *G02F 1/133617* (2013.01); *H01L 33/505* (2013.01); *H01L 33/508* (2013.01)

(56) References Cited

U.S. PATENT DOCUMENTS

| | | | |
|---|---|---|---|
| 8,259,281 B2* | 9/2012 | Takahashi | G02B 6/0031 349/161 |
| 2007/0064444 A1* | 3/2007 | Kim | G02B 6/0068 362/612 |
| 2008/0170177 A1* | 7/2008 | Chen | G02B 6/0068 349/64 |
| 2008/0225203 A1 | 9/2008 | Kim | |
| 2008/0272385 A1* | 11/2008 | Wu | H01L 33/505 257/98 |
| 2009/0237587 A1 | 9/2009 | Won et al. | |
| 2011/0007242 A1 | 1/2011 | Lee et al. | |
| 2011/0255024 A1* | 10/2011 | Chung | G02B 6/0031 349/58 |
| 2012/0106197 A1* | 5/2012 | Lai | B32B 37/12 362/609 |
| 2012/0250329 A1 | 10/2012 | Suehiro et al. | |
| 2012/0287355 A1* | 11/2012 | Oya | G02B 6/0031 348/790 |

FOREIGN PATENT DOCUMENTS

| | | |
|---|---|---|
| JP | 2009-238406 | 10/2009 |
| JP | 2012-212733 | 11/2012 |
| KR | 10-2007-0017837 | 2/2007 |
| KR | 10-2008-0003038 | 1/2008 |
| KR | 10-2008-0083411 | 9/2008 |
| KR | 10-2011-0005134 | 1/2011 |
| TW | 200845411 | 11/2008 |
| TW | 201217862 | 5/2012 |

OTHER PUBLICATIONS

Final Office Action dated Jul. 22, 2016 in U.S. Appl. No. 14/369,993.
Non Final Office Action dated Oct. 28, 2016, in U.S. Appl. No. 14/369,993.
Final Office Action dated Mar. 14, 2017, in U.S. Appl. No. 14/369,993.
Japanese Office Action dated May 9, 2017, for the Japanese Application No. 2015-543963. (English translation from Global Dossier).

* cited by examiner

BACKLIGHT UNIT

CROSS-REFERENCE TO RELATED APPLICATIONS

This application is a continuation-in-part of International Application No. PCT/KR2013/010425, filed on Nov. 15, 2013, which claims priority from and the benefit of Korean Patent Application No. 10-2012-0131685, filed on Nov. 20, 2012, which are hereby incorporated by reference for all purposes as if fully set forth herein.

BACKGROUND

Field

The present invention relates to a backlight unit, and more particularly, to a backlight unit capable of minimizing a non-light emitting region at an edge thereof while realizing a slim structure.

Discussion of the Background

General backlight units are broadly used for liquid crystal displays or surface lighting.

Backlight units of liquid crystal displays can be classified into direct type and edge type backlight units according to locations of light emitting devices.

The direct type backlight units have been mainly developed along with production of large-size liquid crystal displays having a size of 20 inches or more, and include a plurality of light sources under a diffusive plate to directly emit light towards a front side of a liquid crystal display pane. The direct type backlight units are mainly used in large-screen liquid crystal displays requiring high brightness due to higher light use efficiency than the edge type backlight units.

The edge type backlight units are mainly applied to relatively small liquid crystal displays such as monitors of laptop computers and desktop computers. Such an edge type backlight unit has good uniformity of light and long lifespan, and is advantageous in thickness reduction of a liquid crystal display.

Figure 1:
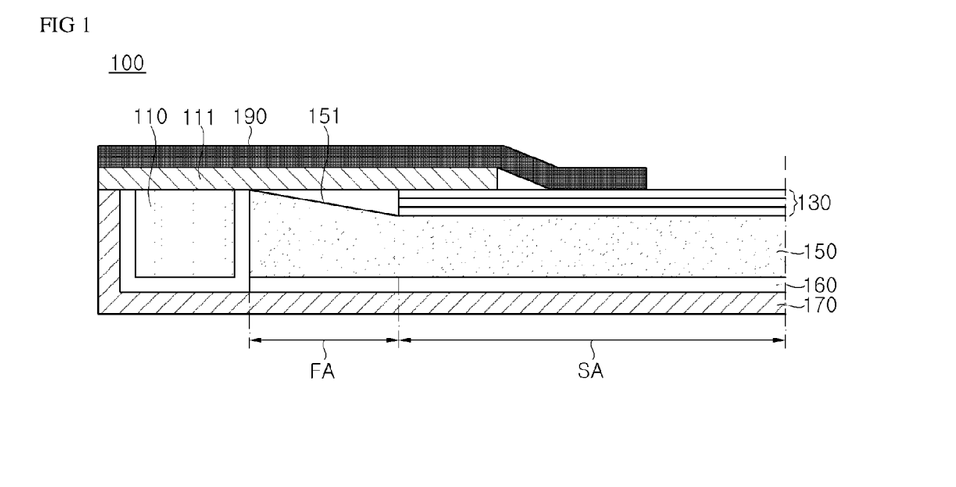
FIG. 1 is a schematic sectional view of a backlight unit of a general small-size liquid crystal display device.

FIG. 1 is a schematic sectional view of a backlight unit of a general small liquid crystal display device Referring to FIG. 1, a backlight unit 100 of a general small liquid crystal display includes a housing 170, which is open at an upper side thereof and receives a reflective sheet 160, a light guide plate 150 and optical sheets 130 therein; a circuit board 111, and a light emitting device 110, which are disposed at one side of the housing 170.

The backlight unit 100 constitutes one module by attaching a light shielding tape 190 to an upper surface of the circuit board 111 and to a portion of an upper surface of the optical sheets 130.

Although not shown in detail, the light emitting device 110 includes a light emitting diode chip mounted inside a frame and has a package structure.

The light guide plate 150 includes a first area (FA), which has a gradually decreasing thickness with increasing distance from an area adjoining the light emitting device 110, and a second area (SA) having a constant thickness. Here, the general package type light emitting device 110 has a limit in realizing size reduction to a certain size or less due to structural features thereof. Thus, the first area (FA) has a light incident face corresponding to the size of the light emitting device 110, and has a gradually decreasing thickness corresponding to the thickness of the second area (SA).

The general backlight unit 100 can minimize loss of light emitted from the light emitting device 110 using the light guide plate 150 including the first area (FA) having a gradually decreasing thickness. However, the general backlight unit 100 has a limit in thickness reduction of the light guide plate 150 due to the size of the light emitting device 110. Thus, there is a difficulty following recent trend of decreasing the thickness of backlight units. Moreover, the first area (FA) has a slope 151 on an upper portion thereof thereby causing problems such as light loss due to light leakage, total reflection, and the like.

The above information disclosed in this Background section is only for enhancement of understanding of the background of the invention and therefore it may contain information that does not form any part of the prior art nor what the prior art may suggest to a person of ordinary skill in the art.

SUMMARY

The present invention is aimed at providing a technology capable of achieving a slim structure of a backlight unit.

In addition, the present invention is aimed at providing a backlight unit having good appearance by minimizing a non-light emitting area at an edge thereof.

Further, the present invention is aimed at providing a backlight unit which realizes a slim structure and has a minimized non-light emitting area using a light emitting diode chip exhibiting excellent light efficiency.

Additional features of the invention will be set forth in the description which follows, and in part will be apparent from the description, or may be learned by practice of the invention.

In accordance with one aspect of the present invention, a backlight unit includes: a light guide plate having an overall flat structure; a light emitting device disposed on at least one side of the light guide plate; a first reflector disposed under the light guide plate and having one side extending to an area in which the light emitting device is disposed; a second reflector disposed on the light emitting device; and a housing receiving the light guide plate, the light emitting device, and the first and second reflectors, wherein the housing has a side portion on which the light emitting device is received, the side portion having a cross-section including a first side defined as a lower surface of the housing, a second side vertically extending from the first side in an upper direction of the housing and a third side horizontally extending from the second side in an inner direction of the housing, and the light emitting device includes a flip-chip type light emitting diode chip and a wavelength conversion layer covering an upper surface and both side surfaces of the light emitting diode chip.

The backlight unit may further include a circuit board disposed on the second side within the housing.

The circuit board may have one surface facing the second side within the housing and the other surface on which the light emitting device is mounted.

The first reflector may have an upper surface facing a lower surface of the light guide plate and one side surface of the light emitting device, and a distal end facing a portion of the other side of the circuit board.

The second reflector may have a portion extending to a position between the second side and the circuit board.

The second reflector may have a portion of an upper surface contacting a lower surface of the third side, a portion of a lower surface contacting a portion of the circuit board, and another portion of the lower surface contacting a portion of an upper surface of the light guide plate.

The wavelength conversion layer includes a first layer covering the upper surface of the light emitting diode chip and a second layer covering both side surfaces of the light emitting diode chip, wherein the first layer has a higher thickness than the second layer.

The backlight unit further includes: optical sheets disposed on the light guide plate; and a light shielding tape disposed parallel to the upper area to cover edges of the optical sheets to secure the optical sheets while preventing light leakage.

In accordance with another aspect of the present invention, a backlight unit includes: a light guide plate having an overall flat structure; a light emitting device disposed on at least one side of the light guide plate; and a housing receiving the light guide plate and the light emitting device, and having a side portion on which the light emitting device is received, the side portion including a first side defined as a lower surface of the housing, a second side vertically extending from the first side in an upper direction of the housing, and a third side horizontally extending from the second side in an inner direction of the housing, wherein the light emitting device includes a flip-chip type light emitting diode chip and a wavelength conversion layer covering an upper surface and both side surfaces of the light emitting diode chip, wherein the wavelength conversion layer includes a first layer covering the upper surface of the light emitting diode chip and a second layer covering both side surfaces of light emitting diode chip, and the first layer has a higher thickness than the second layer.

The housing has a 'ㄱ' structure divided into an upper area, a side area and a lower area from top to bottom, and the backlight unit further includes a circuit board disposed on the side area within the housing.

The circuit board may have one surface facing the side area within the housing, and the other surface on which the light emitting device is mounted.

The circuit board may further include a circuit board disposed on the second side within the housing.

The first reflector may have an upper surface facing a lower surface of the light guide plate and one side surface of the light emitting device, and a distal end facing a portion of the other surface of the circuit board.

The second reflector may have a portion extending to a position between the side area and the circuit board.

The second reflector may have a portion of an upper surface contacting a lower surface of the upper area, a portion of a lower surface contacting a portion of the circuit board, and another portion of the lower surface contacting a portion of an upper surface of the light guide plate.

The light emitting device includes a flip-chip type light emitting diode chip directly mounted on the circuit board and a wavelength conversion layer covering an upper surface and both side surfaces of the light emitting diode chip, wherein the wavelength conversion layer includes a first layer covering the upper surface of the light emitting diode chip and a second layer covering both side surfaces of the light emitting diode chip, and the first layer has a higher thickness than the second layer.

The backlight unit may further include optical sheets disposed on the light guide plate and a light shielding tape disposed parallel to the upper area to cover edges of the optical sheets to secure the optical sheets while preventing light leakage.

According to the present invention, the backlight unit is advantageous in realizing a slim structure through an optimized structure of the light emitting device, the housing and the reflectors so as to apply the light guide plate having an overall flat and thin structure, and has an advantage of providing good appearance by minimizing the non-light emitting area.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

FIG. 3a is a specific plan view of a light emitting diode chip of FIG. 2 and FIG. 3b is a sectional view of the light emitting diode chip taken along line I-I' of FIG. 3a.

DETAILED DESCRIPTION OF THE ILLUSTRATED EMBODIMENTS

Hereinafter, embodiments of the present invention will be described in detail with reference to the accompanying drawings. It should be understood that the following embodiments are provided for complete disclosure and thorough understanding of the invention by those skilled in the art. Thus, it should be understood that the present invention is not limited to the following embodiments and may be embodied in different ways. In addition, in the drawings, the shapes and the like of components may be exaggerated for convenience. Like components will be denoted by like reference numerals throughout the specification. It should be understood by those skilled in the art that various modifications, changes, and alterations can be made without departing from the spirit and scope of the invention. The scope of the invention should be limited only by the accompanying claims and equivalents thereof.

Hereinafter, exemplary embodiments of the present invention will be described in detail with reference to the accompanying drawings for easy implementation of the present invention by those skilled in the art.

Figure 2:
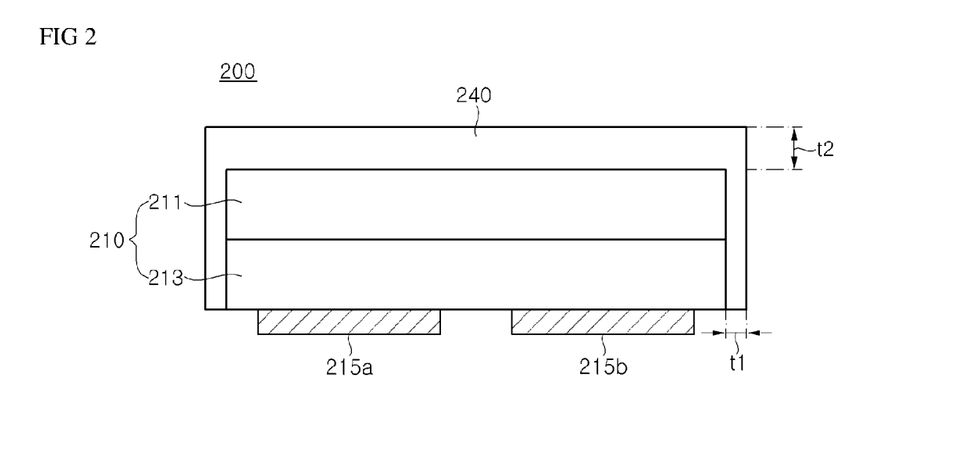
FIG. 2 is a schematic sectional view of a light emitting device of a backlight unit according to the present invention.

FIG. 2 is a schematic sectional view of a light emitting device of a backlight unit according to the present invention.

Referring to FIG. 2, a light emitting device 200 of a backlight unit according to the present invention includes a light emitting diode chip 210 and a wavelength conversion layer 240.

The light emitting diode chip 210 includes a substrate 211 and a semiconductor stack 213, and may further include electrode pads 215a, 215b.

The light emitting diode chip 210 is a flip chip and the electrode pads 215a, 215b are disposed under the light emitting diode chip.

The substrate 211 may be a growth substrate for growing semiconductor layers. For example, the substrate 211 may be a sapphire substrate or a gallium nitride substrate. In particular, when the substrate 211 is a sapphire substrate, the semiconductor stack 213, the sapphire substrate 211 and the wavelength conversion layer 240 have gradually decreasing indices of refraction in order, thereby improving light extraction efficiency. In a specific embodiment, the substrate 211 may be omitted.

The semiconductor stack 213 may be formed of a gallium nitride-based compound semiconductor and emit ultraviolet or blue light.

The light emitting diode chip 210 is directly mounted on a circuit board (not shown). The light emitting diode chip 210 is directly connected to a printed circuit on the circuit board by flip-chip bonding without using a bonding wire. According to the present invention, since the bonding wire is not used to bond the light emitting diode chip 210 to the circuit board, there is no need for a molding section for protection of the bonding wire and for partial removal of the wavelength conversion layer 240 to expose the bonding pads. Thus, use of the flip chip type light emitting diode chip enables removal of color deviation and brightness spots, and simplification of a module preparation process, as compared with use of a light emitting diode chip using the bonding wire.

The wavelength conversion layer 240 covers the light emitting diode chip 210. As shown, the wavelength conversion layer 240 surrounds an upper surface and both side surfaces of the light emitting diode chip 210. For example, a phosphor layer may be formed on the light emitting diode chip 210 and perform wavelength conversion of light emitted from the light emitting diode chip 210. The wavelength conversion layer 240 may be coated onto the light emitting diode chip 210 and may cover the upper surface and the side surfaces of the light emitting diode chip 210 in a predetermined thickness.

The wavelength conversion layer 240 may have a first layer covering both side surfaces of the light emitting diode chip 210 and a second layer covering the upper surface of the light emitting diode chip 210, in which the first layer has a thinner thickness (t1) than a thickness (t2) of the second layer. Here, the light emitting diode chip 210 is a flip chip type, and has a larger amount of light emitted toward both side surfaces of the light emitting diode chip than the amount of light emitted toward the upper surface thereof. Thus, the light emitting diode chip 210 according to the present invention is designed such that the thickness (t2) of the second layer receiving relatively large amounts of light is thicker than the thickness (t1) of the first layer in order to obtain light in a desired wavelength range.

With the wavelength conversion layer 240 and light emitted from the light emitting diode chip 210, the light emitting device can realize light having various colors, particularly, mixed light such as white light.

According to the present invention, the wavelength conversion layer 240 may be previously formed on the light emitting diode chip 210 to be mounted on the circuit board together with the light emitting diode chip 210.

The structure of the light emitting diode chip 210 will be described in detail with reference to FIGS. 3a and 3b.

Figure 3:
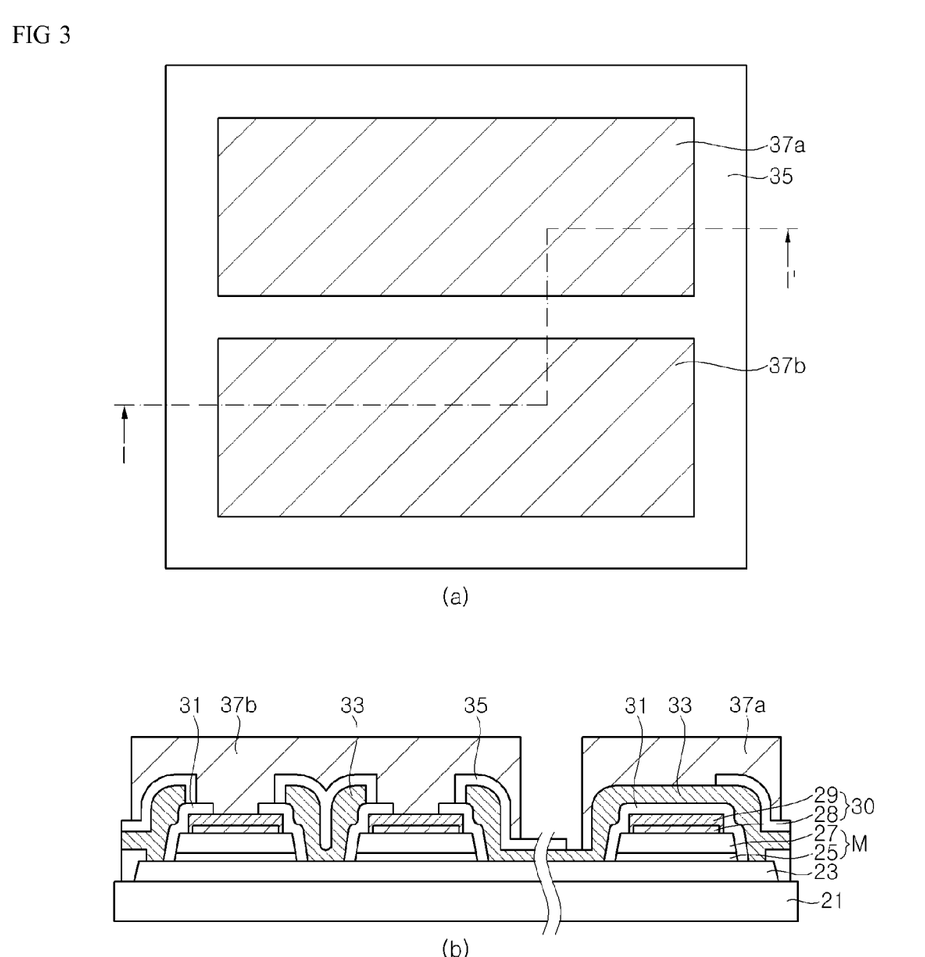

FIG. 3a is a specific plan view of the light emitting diode chip of FIG. 2, and FIG. 3b is a sectional view of the light emitting diode chip taken along line I-I' of FIG. 3a.

Referring to FIGS. 3a and 3b, the light emitting diode chip according to the invention includes a first conductive type semiconductor layer 23 formed on a growth substrate 21, and a plurality of mesas (M) formed on the first conductive type semiconductor layer 23 and separated from each other. Each of the mesas (M) includes an active layer 25 and a second conductive type semiconductor layer 27. The active layer 25 is disposed between the first and second conductive type semiconductor layers 23, 27. Reflective electrodes 30 are disposed on the plurality of mesas (M), respectively.

As shown, the plurality of mesas (M) may have an elongated shape extending in one direction to be parallel to each other. Such a shape of the mesas can simplify formation of the plurality of mesas M having the same shape in a plurality of chip areas on the growth substrate 21.

The reflective electrodes 30 may be respectively formed on the mesas M after the plurality of mesas M are formed, but are not limited thereto. Alternatively, after the second conductive type semiconductor layer 27 is grown, the reflective electrodes 30 may be formed on the second conductive type semiconductor layer 27 before the plurality of mesas M are formed. The reflective electrode 30 covers an overall upper surface of the mesa M and has substantially the same shape as the shape of the mesa M in top view.

The reflective electrodes 30 include a reflective layer 28 and may further include a barrier layer 29. The barrier layer 29 may cover an upper surface and side surfaces of the reflective layer 28. For example, a pattern of the reflective layer 28 is formed and the barrier layer 29 is formed thereon, whereby the barrier layer 29 can be formed to cover the upper and side surfaces of the reflective layer 28. For example, the reflective layer 28 may be formed through deposition and patterning of Ag, Ag alloy, Ni/Ag, NiZn/Ag, or TiO/Ag layers. The barrier layer 29 may be formed of Ni, Cr, Ti, Pt, Rd, Ru, W, Mo, TiW or combinations thereof, and prevents diffusion or contamination of metallic materials of the reflective layer.

After the plurality of mesas M are formed, an edge of the first conductive type semiconductor layer 23 may also be etched. As a result, an upper surface of the growth substrate 21 can be exposed. The first conductive type semiconductor layer 23 may have a slanted side surface.

According to the present invention, the light emitting diode chip further includes a lower insulation layer 31 covering the plurality of mesas M and the first conductive type semiconductor layer 23. The lower insulation layer 31 has openings formed at predetermined locations thereof to allow electrical connection to the first conductive type semiconductor layer 23 and the second conductive type semiconductor layer 27 therethrough. For example, the lower insulation layer 31 may have openings through which the first conductive type semiconductor layer 23 is exposed, and openings through which the reflective electrodes 30 are exposed.

The openings may be disposed between the mesas M and near the edge of the substrate 21, and may have an elongated shape extending along the mesas M. In addition, the openings are disposed only above the mesas M to be biased towards the same ends of the mesas.

The light emitting diode chip according to the present invention includes a current spreading layer 33 formed on the lower insulation layer 31. The current spreading layer 33 covers the plural mesas (M) and the first conductive type semiconductor layer 23. In addition, the current spreading layer 33 is disposed within an upper area of each of the mesas (M) and has openings for exposing the reflective electrodes. The current spreading layer 33 may form ohmic contact with the first conductive type semiconductor layer 23 through the openings of the lower insulation layer 31. The current spreading layer 33 is insulated from the plurality of mesas M and the reflective electrodes 30 by the lower insulation layer 31.

Each of the openings of the current spreading layer 33 has a larger area than the openings of the lower insulation layer 31 to prevent the current spreading layer 33 from being connected to the reflective electrodes 30.

The current spreading layer 33 is formed over the substantially entirety of the upper area of the substrate 21 excluding the openings. This structure allows electric current to easily spread through the current spreading layer 33. The current spreading layer 33 may include a highly reflective metal layer such as an Al layer. The highly reflective metal layer may be formed on a bonding layer such as a Ti, Cr or Ni bonding layer. In addition, a protective layer having a single layer or multilayer structure of Ni, Cr, Au, and the like may be formed on the highly reflective metal layer. The current spreading layer 33 may have, for example, a multilayer structure of Ti/Al/Ti/Ni/Au.

According to the present invention, the light emitting diode chip has an upper insulation layer 35 formed on the current spreading layer 33. The upper insulation layer 35 has openings through which the current spreading layer 33 is exposed and openings through which the reflective electrodes 30 are exposed.

The upper insulation layer 35 may be formed of an oxide insulation layer, a nitride insulation layer, a combination layer or alternating layers of these insulation layers, or may be formed using polymers such as polyimides, Teflon, Parylene, and the like.

A first pad 37a and a second pad 37b are formed on the upper insulation layer 35. The first pad 37a is connected to the current spreading layer 33 through the opening of the upper insulation layer 35, and the second pad 37b is connected to the reflective electrodes 30 through the openings of the upper insulation layer 35. The first and second pads 37a, 37b may be used as pads for connection of bumps or for SMT in order to mount the light emitting diode on the circuit board.

The first and second pads 37a, 37b may be formed together by the same process, for example, by photolithography and etching or by a lift-off process. The first and second pads 37a, 37b may include, for example, a bonding layer such as Ti, Cr or Ni, and a highly conductive metal layer such as Al, Cu, Ag or Au. Each of the first and second pads 37a, 37b may be formed to have both ends thereof disposed on the same plane, whereby the light emitting diode chip may be flip-chip bonded onto a conductive pattern, which is formed to the same height on the circuit board.

Then, the growth substrate 21 is divided into individual light emitting diode chip units, thereby completing fabrication of light emitting diode chips. The growth substrate 21 may be removed from the light emitting diode chips before or after being divided into the individual light emitting diode chip units.

As described above, the light emitting diode chip according to the present invention can realize high efficiency and a small structure, as compared with a general package type light emitting device.

Figure 4:
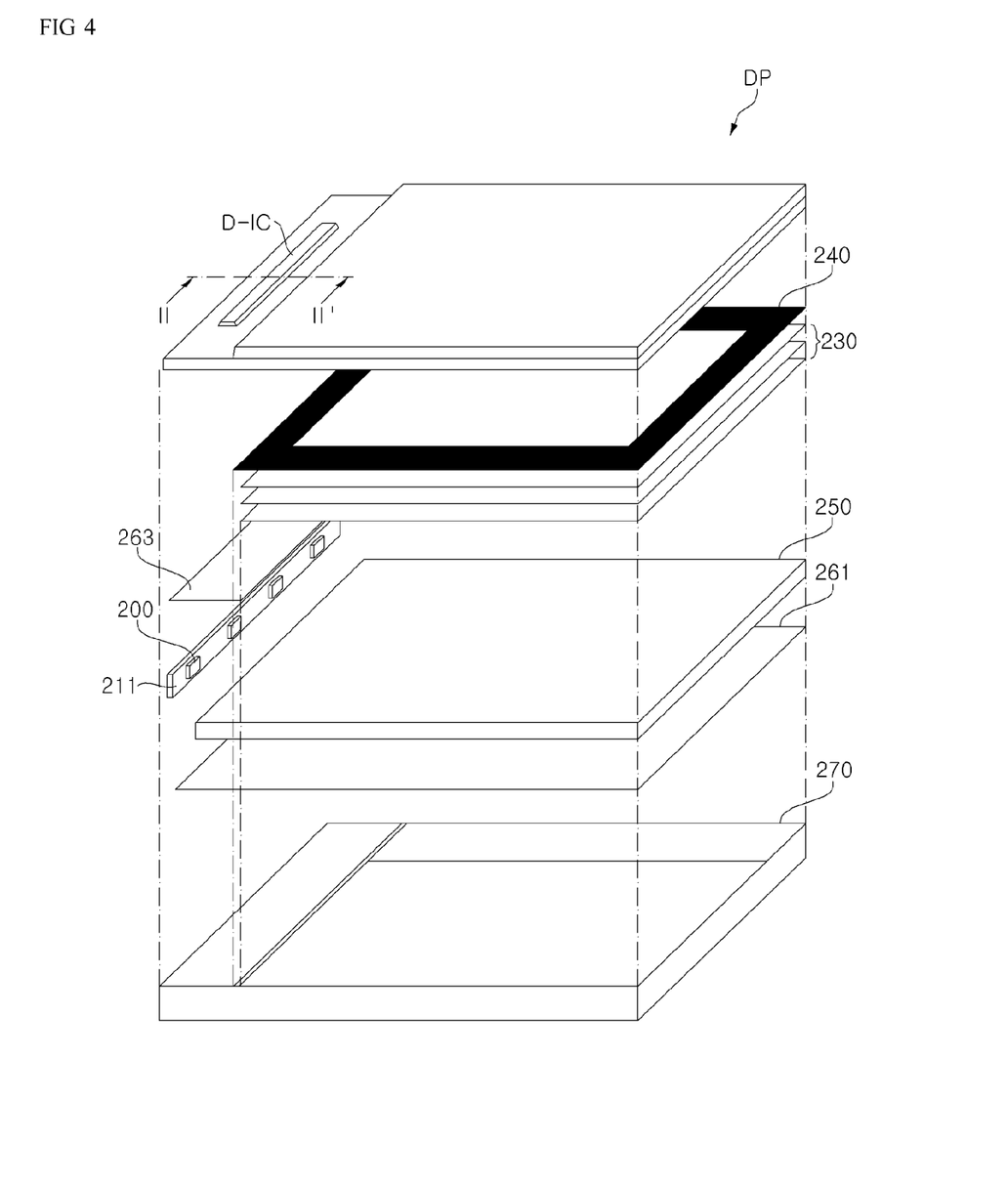
FIG. 4 is an exploded perspective view of a display device including a backlight unit according to one embodiment of the present invention.
Figure 5:
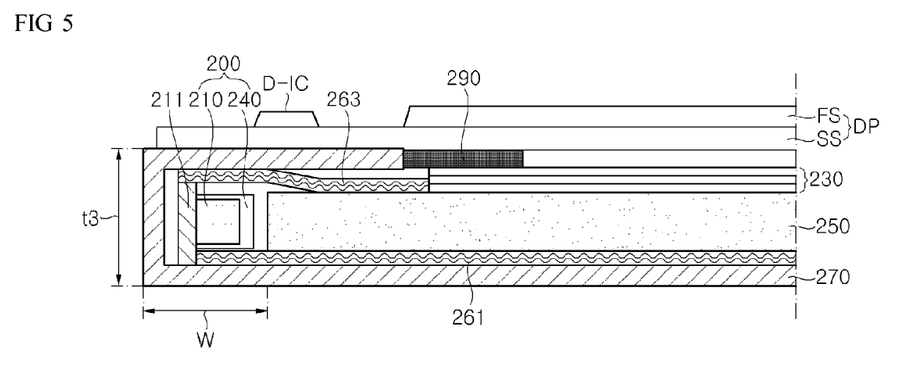
FIG. 5 is a sectional view of the display device taken along line II-II' of FIG. 4.

FIG. 4 is an exploded perspective view of a display device including a backlight unit according to one embodiment of the present invention and FIG. 5 is a sectional view of the display device taken along line II-II' of FIG. 4.

Referring to FIGS. 4 and 5, a small-size display device according to one embodiment of the invention includes a display panel (DP), and a backlight unit (BLU) disposed at a rear side of the display panel (DP) and emitting light.

The display panel (DP) includes a color filter substrate and a thin film transistor substrate assembled to each other to maintain a uniform cell gap therebetween while facing each other. According to the type, the display panel (DP) may further include a liquid crystal layer between the color filter substrate (FS) and the thin film transistor substrate (SS).

Although not shown in detail in the drawings, the thin film transistor substrate (SS) includes a plurality of gate lines and data lines crossing each other to define pixels therebetween, and a thin film transistor disposed in each of crossing areas between the gate lines and the data lines to be connected to a pixel electrode disposed in each of the pixels in one-on-one correspondence. The color filter substrate (FS) includes RGB color filters corresponding to the respective pixels, a black matrix disposed along the periphery of the substrate and shielding the gate lines, data lines and thin film transistors, and a common electrode covering all of these components.

The display panel (DP) includes a driver IC (D-IC) mounted on one edge thereof. The driver IC (D-IC) generates driving signals driving the display panel in response to external signals.

The backlight unit (BLU) supplying light to the display panel (DP) includes a housing 270 partially open at an upper side thereof, a circuit board 211 disposed on one side within the housing 270, a plurality of light emitting devices 200 mounted on the circuit board 211, and a light guide plate 250 disposed parallel to the light emitting devices 200 to convert point light into surface light.

In addition, the backlight unit (BLU) according to the invention includes optical sheets 230 disposed on the light guide plate 250 to diffuse and collect light, a first reflector 261 disposed below the light guide plate 250 to reflect light travelling in a lower direction of the light guide plate 250 toward the display panel (DP), a second reflector 263 disposed above the light guide plate 250 to guide light from the light emitting devices 200 into the light guide plate 250, and a light shielding tape 290 disposed at an edge of the optical sheets 230 to prevent light leakage and to secure the optical sheets 230.

The light shielding tape 290 includes adhesives on both sides thereof has a black color, and serves to prevent light emitted from the backlight unit (BLU) from leaking to the outside or to an edge of the display panel (DP).

One side of the housing 270, on which the light emitting device 200 is disposed, has a cross-section of a 'ㄱ' structure.

The 'ㄱ' structure may have a first side defined as a lower surface of the housing 270, a second side vertically extending in an upper direction from the first side, and a third side horizontal extending in an inner direction of the housing 270 from the second side.

Here, the light shielding tape 290 is disposed parallel to the third side of the 'ㄱ' structure and has no overlapping area therewith.

Although the housing 270 is illustrated as having the 'ㄱ' structure only at one side of the backlight unit (BLU), the present invention is not limited thereto and may have the 'ㄱ' structure at both sides, three sides or all four sides of the backlight unit (BLU) depending upon locations of the light emitting devices 200.

The circuit board 211 is disposed on an inner side of the 'ㄱ' structure of the housing 270. That is, the circuit board 211 is secured at one surface thereof to the second side of the '⊤' structure. That is, an adhesive material may be formed between the one surface of the circuit board 211 and the second side. The circuit board 211 has the other surface facing a lower surface of the light emitting device 200. Here, a surface having an electrode of the light emitting device 200 formed thereon is defined as the lower surface.

The light emitting device 200 includes a light emitting diode chip 210 and a wavelength conversion layer 240. The wavelength conversion layer 240 may have a first layer covering both side surfaces of the light emitting diode chip 210 and a second layer covering an upper surface of the light emitting diode chip 210, in which the first layer has a thinner thickness than the thickness of the second layer.

The upper surface of the light emitting device 200 faces a light incident face of the light guide plate 250. Here, the light incident face may be defined as one side surface of the light guide plate 250, through which light emitted from the light emitting device 200 enters the light guide plate 250.

In addition, the light emitting device 200 has side surfaces facing the first and second reflectors 261, 263, respectively.

The first and second reflectors 261, 263 may be prepared by coating a reflective material onto a surface of a base layer, or may be formed of a base layer composed of a reflective material. In addition, the first and second reflectors 261, 263 may further include an adhesive material formed on the surface of the base layer.

The first and second reflectors 261, 263 enclose the light emitting device 200, and cover the overall lower surface and the partial upper surface of the light guide plate 250, respectively.

The first reflector 261 may contact the overall lower surface of the light guide plate 250, and may have one side, which extends in a direction of the light emitting device 200 to contact a portion of the other surface of the circuit board 211 while facing one side surface of the light emitting device 200. That is, the first reflector 261 may have an upper surface facing the lower surface of the light guide plate 250 and the one side surface of the light emitting device 200, and a distal end facing the portion of the other surface of the circuit board 211. Thus, according to the present invention, light emitted from the light emitting device 200 can be incident on the light guide plate 250 without loss due to the first reflector 261 enclosing the portion of the other surface of the circuit board 211 and the one side surface of the light emitting device 200.

The second reflector 263 may contact a portion of the upper surface of the light guide plate 250, and may be disposed between a portion of the circuit board 211 and the third side of the housing 270. That is, the second reflector 263 may have a portion of an upper surface contacting a lower surface of the third side of the housing 270, a portion of a lower surface contacting the portion of the circuit board 211, and another portion of the lower surface contacting the portion of the upper surface of the light guide plate 250.

According to the present invention, with the housing 270 of the '⊤' structure, the high-efficiency flip-chip type light emitting device 200 received in the housing, and the structure in which the first and second reflectors 261, 263 enclose the light emitting device 200, the backlight unit (BLU) can be prepared to a total thickness (t3), which is 0.2 mm or more thinner than that of a general backlight unit.

In addition, the backlight unit (BLU) according to the present invention can reduce a width (W) of the non-light emitting area by 0.4 mm or more as compared with the general backlight unit by minimizing a margin for receiving the light emitting device 200, with the housing 270 of the '⊤' structure, the high-efficiency flip-chip type light emitting device 200 received in the housing, and the structure in which the first and second reflectors 261, 263 enclose the light emitting device 200.

As described above, the backlight unit (BLU) according to the embodiment of the present invention is advantageous in realizing a slim structure through an optimized structure of the light emitting device 200, the housing 270 and the first and second reflectors 261, 263 so as to apply the light guide plate 250 having an overall flat and thin structure, and has an advantage of providing good appearance by minimizing the non-light emitting area.

Although the present invention is illustrated as having the structure in which the first reflector 261 is separated a predetermined distance from one side surface of the light emitting diode chip 210 with reference to FIG. 5, it should be understood that the present invention is not limited thereto and may also be embodied by a structure wherein the first reflector 261 contacts the one side surface of the light emitting diode chip 210.

Figure 6:
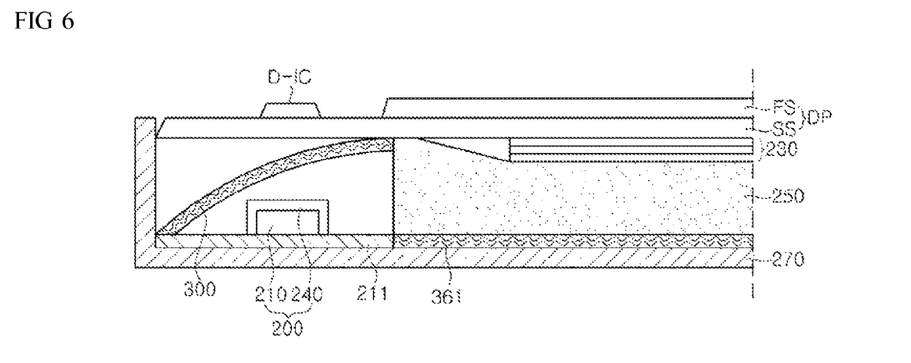
FIG. 6 and FIG. 7 are an exploded perspective view of a display device including a backlight unit according to another embodiment of the present invention.
Figure 7:
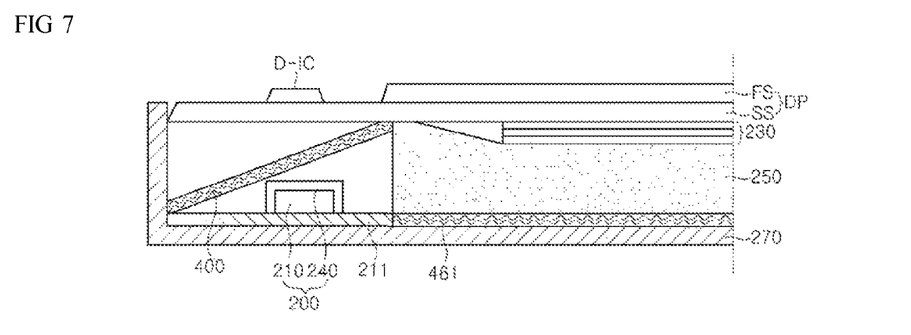

FIG. 6 and FIG. 7 are an exploded perspective view of a display device including a backlight unit according to another embodiment of the present invention.

Referring to FIGS. 6 and 7, the display device according to the other embodiment includes the same components as those of the display device according to the one embodiment except for a first reflector 361, 461 and a second reflector 300, 400. Thus, the same components will be denoted by the same reference numerals, and detailed descriptions thereof will be omitted except for the second reflector 300, 400.

The circuit board 211 is disposed on the housing 270.

The light emitting device 200 includes a light emitting diode chip 210 and a wavelength conversion layer 240. The light emitting device 200 is disposed on an upper surface of the circuit board 211. The wavelength conversion layer 240 may have a first layer covering both side surfaces of the light emitting diode chip 210 and a second layer covering an upper surface of the light emitting diode chip 210, in which the first layer has a thinner thickness than the thickness of the second layer.

One side surface of the light emitting device 200 faces a light in a light incident face of the light guide plate 250. Here, the light incident face may be defined as one side surface of the light guide plate 250, through which light emitted from the light emitting device 200 enters the light guide plate 250.

The second reflector 300, 400 is disposed on the light emitting device 200 and the circuit board 211. The second reflector 300, 400 is disposed on an inner side of the housing 270. The second reflector 300, 400 comprise in a curvature structure or in an inclined structure. The second reflector 300, 400 includes one side surface to contact a portion of the upper surface of the circuit board 211 and the other side surface to contact a portion of the side surface of light guide plate 250. That is, the first reflector may have the one side surface facing the portion of the upper surface of the circuit board 211, the other side surface facing the portion of the side surface of light guide plate 250. The second reflector 300, 400 may be prepared by coating a reflective material onto a surface of a base layer, or may be formed of a base layer composed of a reflective material. In addition, the second reflector 300, 400 may further include an adhesive material formed on the surface of the base layer. The first reflector 361, 461 is disposed under the light guide plate 250.

According to the present invention, light emitted from the light emitting device 200 can be incident on the light guide plate 250 without loss due to the second reflector 300, 400 enclosing the portion of the other surface of the circuit board 211 and the one side surface of the light emitting device 200.

Although some embodiments have been described herein, it should be understood that the present invention is not limited to certain embodiments. In addition, some features of a certain embodiment may also be applied to other embodiments in the same or similar ways without departing from the spirit and scope of the present invention.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A backlight unit comprising:
   a light guide plate;
   a light emitting device disposed adjacent to a first side of the light guide plate;
   a first reflector disposed under the light guide plate and having one side adjacent to an area in which the light emitting device is disposed;
   a second reflector disposed above the light emitting device;
   a housing receiving the light guide plate, the light emitting device, the first reflector, and the second reflector; and
   a thin film transistor substrate directly contacting top surfaces of the second reflector and the light guide plate,
   wherein the second reflector comprises a curved or inclined structure, a first distal end of the second reflector contacting a circuit board and a second distal end contacting the light guide plate,
   wherein the housing has a side portion on which the light emitting device is received, the side portion having a cross-section comprising a first side defined as a lower surface of the housing, and a second side vertically extending from the first side in an upper direction of the housing, and
   wherein the first distal end of the second reflector contacts the second side of the housing and an upper surface of the circuit board, and the second distal end of the second reflector contacts a side surface of the light guide plate.

2. The backlight unit of claim 1,
   wherein the light emitting device comprises a flip-chip light emitting diode chip and a wavelength conversion layer covering an upper surface and both side surfaces of the light emitting diode chip.

3. The backlight unit of claim 2, wherein the circuit board is disposed on the first side within the housing.

4. The backlight unit of claim 3, wherein the circuit board has one surface facing the first side within the housing, and another surface on which the light emitting device is mounted.

5. The backlight unit of claim 4, wherein the first reflector has an upper surface facing a lower surface of the light guide plate, and the distal end faces a distal end of the circuit board.

6. The backlight unit of claim 3, wherein the second reflector extends between the second side of the housing and the light guide plate.

7. The backlight unit of claim 3, further comprising:
   optical sheets disposed on the light guide plate; and
   a light shielding tape disposed parallel to the first side of the housing, the light shielding tape covering edges of the optical sheets in order to secure the optical sheets while preventing light leakage.

8. The backlight unit of claim 2, wherein the wavelength conversion layer comprises a first layer covering the upper surface of the light emitting diode chip and a second layer covering both side surfaces of the light emitting diode chip, the first layer having a thickness that is greater than a thickness of the second layer.

9. A backlight unit comprising:
   a light guide plate;
   a light emitting device disposed adjacent to a first side of the light guide plate;
   a housing receiving the light guide plate and the light emitting device;
   a first reflector disposed under the light guide plate;
   a second reflector covering the light emitting device;
   a circuit board disposed between the housing and the light emitting device; and
   a thin film transistor substrate directly contacting top surfaces of the second reflector and the light guide plate,
   wherein the light emitting device comprises a flip-chip light emitting diode chip and a wavelength conversion layer covering an upper surface and both side surfaces of the light emitting diode chip,
   wherein the wavelength conversion layer comprises a first layer covering the upper surface of the light emitting diode chip and a second layer covering both side surfaces of the light emitting diode chip, the first layer having a higher thickness than the second layer,
   wherein the second reflector comprises a curved structure or an inclined structure,
   wherein the housing comprises a side portion receiving the light emitting device, a cross-section of the housing comprising a second side vertically extending in an upper direction based on a first side defined as a lower side, and
   wherein the second reflector has a first distal end contacting the second-side of the housing or an upper surface of the circuit board, and a second distal end contacting a side surface of the light guide plate.

10. The backlight unit of claim 9, wherein the circuit board is disposed on the first side of the housing.

11. The backlight unit of claim 9, wherein the first reflector is disposed under the light guide plate and has one side adjacent to an area in which the light emitting device is disposed.

12. The backlight unit of claim 9, wherein the circuit board is disposed on the first side within the housing,
    wherein the first reflector has an upper surface facing a lower surface of the light guide plate, and a distal end facing a distal end of the circuit board.

13. The backlight unit of claim 9, wherein the second reflector extends between the second side of the housing and the light guide plate.

14. The backlight unit of claim 9, further comprising:
    optical sheets disposed on the light guide plate; and
    a light shielding tape disposed parallel to the first side of the housing, the light shielding tape covering edges of the optical sheets in order to secure the optical sheets while preventing light leakage.

15. The backlight unit of claim 9, wherein the second reflector is disposed parallel to the circuit board.

* * * * *